US011152577B2

(12) United States Patent
Lee et al.

(10) Patent No.: US 11,152,577 B2
(45) Date of Patent: Oct. 19, 2021

(54) ORGANIC LIGHT EMITTING DEVICE

(71) Applicant: SAMSUNG DISPLAY CO., LTD., Yongin-si (KR)

(72) Inventors: Hyunshik Lee, Incheon (KR); Heeseong Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/855,933

(22) Filed: Apr. 22, 2020

(65) Prior Publication Data
US 2020/0251665 A1  Aug. 6, 2020

Related U.S. Application Data

(62) Division of application No. 15/438,847, filed on Feb. 22, 2017, now Pat. No. 10,672,991.

(30) Foreign Application Priority Data

Feb. 23, 2016 (KR) .......................... 10-2016-0021384

(51) Int. Cl.
*H01L 51/00* (2006.01)
*H01L 51/50* (2006.01)

(52) U.S. Cl.
CPC ........ *H01L 51/0072* (2013.01); *H01L 51/005* (2013.01); *H01L 51/0056* (2013.01);
(Continued)

(58) Field of Classification Search
CPC ............... H01L 51/0072; H01L 51/005; H01L 51/0056; H01L 51/0059; H01L 51/5008;
(Continued)

(56) References Cited

U.S. PATENT DOCUMENTS

| 5,536,949 A | 7/1996 | Hosokawa et al. |
| 2002/0179898 A1* | 12/2002 | Marks .................... B82Y 10/00 257/40 |

(Continued)

FOREIGN PATENT DOCUMENTS

| KR | 10-2004-0106923 A | 12/2004 |
| KR | 10-2011-0009060 A | 1/2011 |

(Continued)

OTHER PUBLICATIONS

Yu et al, Approaching Charge Balance in Organic Light-Emitting Diodes by Tuning Charge Injection Barriers with Mixed Monolayers, Langmuir, vol. 28, Issue 1, pp. 424-430, Nov. 21, 2011.*

(Continued)

*Primary Examiner* — Alexander C Kollias
(74) *Attorney, Agent, or Firm* — Lewis Roca Rothgerber Christie LLP

(57) ABSTRACT

An organic light emitting device including a first electrode; a self-assembled monolayer on the first electrode; a hole control layer on the self-assembled monolayer; a light emitting layer on the hole control layer; an electron control layer on the light emitting layer; and a second electrode on the electron control layer, wherein the self-assembled monolayer includes a plurality of organic molecules, each of the plurality of organic molecules having a head bonded to the first electrode, a terminal end adjacent to the hole control layer, and a tail connecting the head with the terminal end.

5 Claims, 14 Drawing Sheets

(52) U.S. Cl.
CPC ...... *H01L 51/0059* (2013.01); *H01L 51/5008* (2013.01); *H01L 51/5012* (2013.01); *H01L 51/5036* (2013.01); *H01L 51/5056* (2013.01); *H01L 51/5072* (2013.01); *H01L 51/5088* (2013.01); *H01L 51/5092* (2013.01); *H01L 51/5096* (2013.01)

(58) Field of Classification Search
CPC ............. H01L 51/5012; H01L 51/5036; H01L 51/5056; H01L 51/5072; H01L 51/5088; H01L 51/5092; H01L 51/5096; H01L 51/0075; H01L 51/5206
See application file for complete search history.

(56) References Cited

U.S. PATENT DOCUMENTS

| | | |
|---|---|---|
| 2004/0021415 A1 | 2/2004 | Vong et al. |
| 2010/0134052 A1 | 6/2010 | Gough et al. |
| 2014/0077202 A1 | 3/2014 | Zhou et al. |

FOREIGN PATENT DOCUMENTS

| | | |
|---|---|---|
| KR | 10-2013-0095645 A | 8/2013 |
| KR | 10-2014-0130791 A | 11/2014 |

OTHER PUBLICATIONS

Bardecker et al, Self-assembled Electroactive Phosphonic Acids on ITO: Maximizing Hole-Injection in Polymer Light-Emitting Diodes, Advance Functional Materials, vol. 18, Issue 24, pp. 3964-3971, Dec. 22, 208.*

Sharma et al, Stabilization of the work function of indium tin oxide using organic surface modifiers in organic light-emitting diodes, Applied Physics Letters, vols. 93, Issue 16, pp. 163308-1-163308-3, Oct. 24, 2008.*

Bardecker et al, Self-assembled Electroactive Phosphonic Acids on ITO: Maximizing Hole-Injection in Polymer Light-Emitting Diodes, Advance Functional Materials, vol. 18, Issue 24, pp. 3964-3971, Dec. 22, 2008.

Losego et al, Characterizing the Molecular Order of Phosphonic Acid Self-Assembled Monolayers on Indium Tin Oxide Surfaces, Langmuir, vol. 27, Issue 19, pp. 11883-11888, Aug. 24, 2011.

* cited by examiner

ORGANIC LIGHT EMITTING DEVICE

CROSS-REFERENCE TO RELATED APPLICATIONS

This application is a divisional of U.S. patent application Ser. No. 15/438,847, filed Feb. 22, 2017, which claims priority to and the benefit of Korean Patent Application No. 10-2016-0021384, filed Feb. 23, 2016, the entire content of both of which is incorporated herein by reference.

BACKGROUND

1. Field

Embodiments relate to an organic light emitting device.

2. Description of the Related Art

Organic light emitting devices are self light emitting type elements, and organic light emitting displays (OLED) including such organic light emitting devices have wide viewing angles and excellent contrast. Moreover, such organic light emitting displays have the advantages of fast response time, high brightness, and low driving voltage.

Organic light emitting devices are being developed into various configurations. Organic light emitting devices achieve color through a mechanism in which holes and electrons injected into a first electrode and a second electrode recombine in a light emitting layer to emit light. The light is emitted when excitons generated by the recombination of the injected holes and electrons fall to the ground state.

SUMMARY

Embodiments are directed to an organic light emitting device

The embodiments may be realized by providing an organic light emitting device including a first electrode; a self-assembled monolayer on the first electrode; a hole control layer on the self-assembled monolayer; a light emitting layer on the hole control layer; an electron control layer on the light emitting layer; and a second electrode on the electron control layer, wherein the self-assembled monolayer includes a plurality of organic molecules, each of the plurality of organic molecules having a head bonded to the first electrode, a terminal end adjacent to the hole control layer, and a tail connecting the head with the terminal end.

At least two organic molecules of the plurality of organic molecules may have tails that are of different lengths from each other.

The tail may extend orthogonally relative to a surface of the first electrode.

The terminal end may be chemically bonded with the hole control layer.

The hole control layer may include an anisotropic compound in which a molecular length in one direction is longer than a molecular length in a another direction that is perpendicular to the one direction.

A long axis of the anisotropic compound may extend orthogonally relative to a surface of the first electrode, the long axis extending in the one direction.

The anisotropic compound may be one of the following Compounds 1 to 8:

1

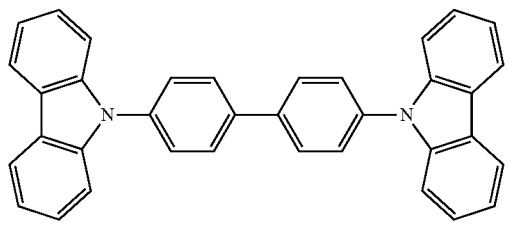

2

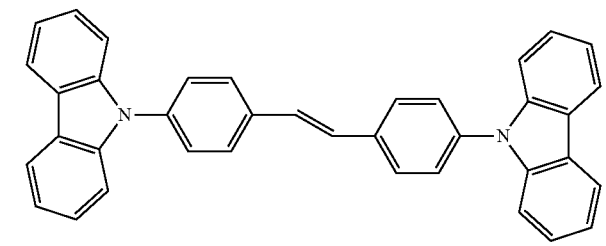

3

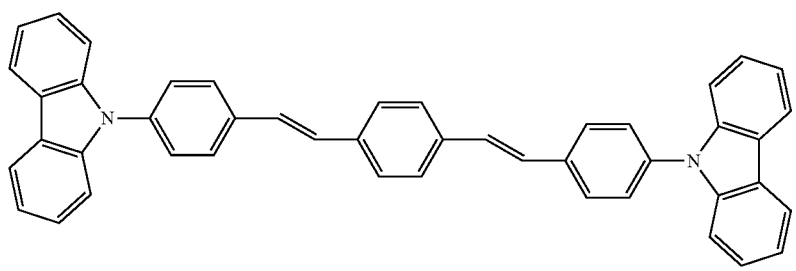

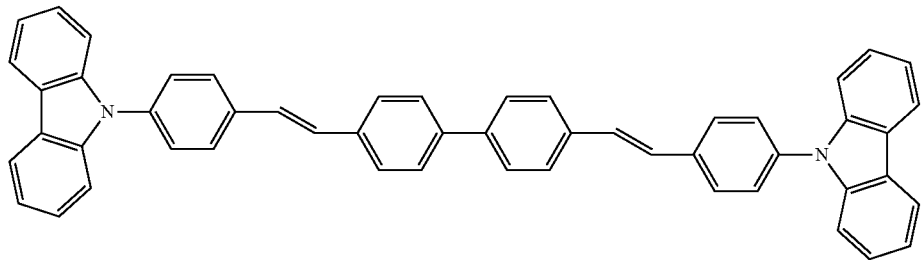

4

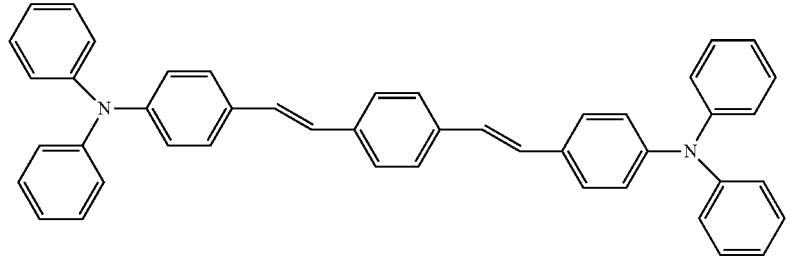

5

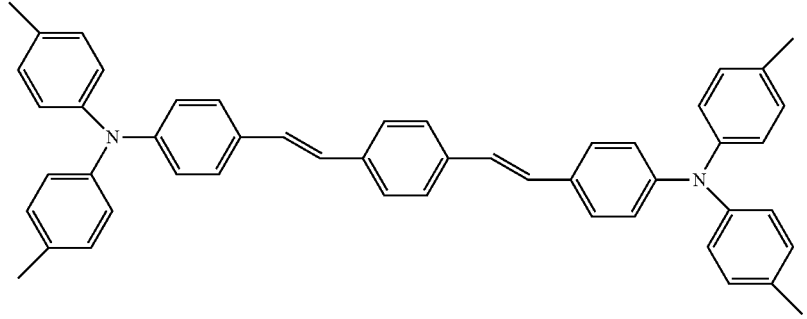

6

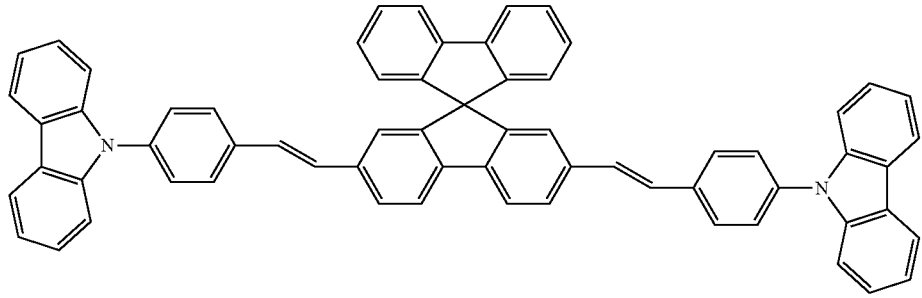

7

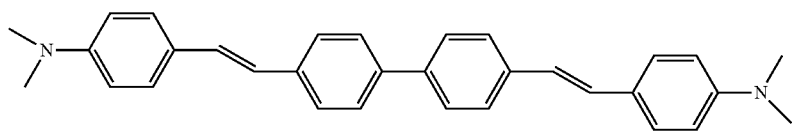

8

The head may include a phosphonic acid group or a silane group.

The tail may include a substituted or unsubstituted alkylene group having a carbon number of 1 to 20.

The carbon number of the alkylene group in one organic molecule of the plurality of organic molecules may be different from the carbon number of the alkylene group in another organic molecule of the plurality of organic molecules.

The terminal end may include hydrogen, a substituted or unsubstituted alkyl group having 1 to 5 carbon atoms, or a substituted or unsubstituted aromatic group having 6 to 30 carbon atoms for forming a ring.

The terminal end may include the substituted or unsubstituted aromatic group having 6 to 30 ring carbon atoms, and the aromatic group may be a phenyl group, a naphthalene group, or an anthracene group.

The self-assembled monolayer may include 8-alkylphosphonic acid and 18-alkylphosphonic acid.

The embodiments may be realized by providing an organic light emitting device including a first electrode; a self-assembled monolayer on the first electrode; a hole control layer on the self-assembled monolayer; a light emitting layer on the hole control layer; an electron control layer on the light emitting layer; and a second electrode on the electron control layer, wherein the self-assembled monolayer includes a plurality of organic molecules, each organic molecule of the plurality of organic molecules being independently represented by Formula 1,

[Formula 1]

wherein, in Formula 1, X is a phosphonic acid group or a silane group, Y is hydrogen, a substituted or unsubstituted alkyl group having 1 to 5 carbon atoms, or a substituted or unsubstituted aromatic group having 6 to 30 carbon atoms for forming a ring, and n is an integer of 2 to 20.

The plurality of organic molecules may be disposed such that X of Formula 1 is bonded with the first electrode and Y of Formula 1 is adjacent to the hole control layer.

The plurality of organic molecules may include a first organic molecule in which n=n1 and a second organic molecule in which n=n2, and n1 and n2 may be integers that are different from each other.

n1 and n2 may satisfy |n1−n2|≥10.

Y may be a phenyl group, a naphthalene group, or an anthracene group.

The hole control layer may include an anisotropic compound in which a length in a long axis direction of the anisotropic compound differs from a length in a short axis direction of the anisotropic compound; and Y of Formula 1 may be chemically bonded with the anisotropic compound.

The long axis direction of the anisotropic compound may be orthogonal to a surface of the first electrode.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
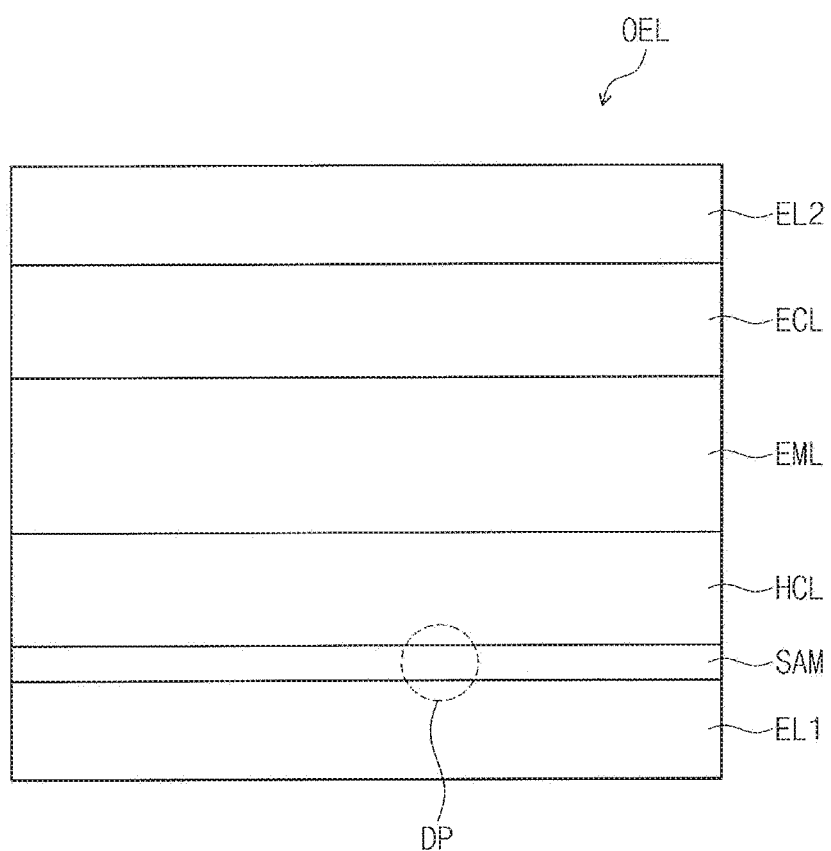
FIG. 1 illustrates a cross-sectional view of an organic light emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another element. For example, a first element could be termed a second element, and similarly, a second element may be termed a first element. Singular forms are intended to include the plural forms as well, unless the context clearly indicates otherwise.

In the specification, terms such as "includes" or "has" specify the presence of stated features, numbers, steps, operations, elements, components, and/or combinations thereof, but do not preclude the presence or addition of one or more other features, numbers, steps, operations, elements, components, and/or combinations thereof. Moreover, when an element such as a layer, film, area, plate, etc. is referred to as being "on" another element, it can be "directly on" the other element, or intervening elements may also be present. When an element such as a layer, film, area, plate, etc. is referred to as being "under" another element, it can be "directly under" the other element, or intervening elements may also be present.

Hereinafter, an organic light emitting device according to embodiments will be described in detail with reference to the accompanying drawings.

FIG. 1 illustrates a cross-sectional view of an organic light emitting device OEL according to an embodiment. The organic light emitting device OEL according to an embodiment may be a sequentially laminated, laminated-type organic light emitting device OEL. Referring to the drawings, the organic light emitting device OEL may include, e.g., a first electrode EL1, a hole control layer HCL, a self-assembled monolayer SAM, a light emitting layer EML, an electron control layer ECL, and a second electrode EL2.

The first electrode EL1 or the second electrode EL2 may be formed of a metal alloy or a conductive compound. The first electrode EL1 and the second electrode EL2 may be disposed facing each other, and a plurality of organic layers may be disposed between the first electrode EL1 and the second electrode EL2. The plurality of organic layers may include, e.g., the self-assembled monolayer SAM, the hole control layer HCL, the light emitting layer EML, and the electron control layer ECL.

The first electrode EL1 or the second electrode EL2 may be a transmissive electrode, a semi-transmissive electrode, or a reflective electrode. When the first electrode EL1 or the second electrode EL2 is a transmissive electrode, the first electrode EL1 or the second electrode EL2 may be formed of a transparent metal oxide, e.g., indium tin oxide (ITO), indium zinc oxide (IZO), zinc oxide (ZnO), or indium tin zinc oxide (ITZO), or the like.

In an implementation, the first electrode EL1 or the second electrode EL2 may be a semi-transmissive electrode or a reflective electrode. The first electrode EL1 or the second electrode EL2 may include silver (Ag), magnesium (Mg), aluminum (Al), platinum (Pt), palladium (Pd), gold (Au), nickel (Ni), neodymium (Nd), iridium (Ir), chrome (Cr), or mixtures thereof. In an implementation, the first electrode EL1 or the second electrode EL2 may be a layer including a compound of lithium (Li), calcium (Ca), lithium fluoride (LiF)/calcium (Ca), LiF/Al, barium fluoride (BaF), barium (Ba), Ag/Mg, and the like, or mixtures thereof.

In an implementation, in the organic light emitting device according to an embodiment, the first electrode EL1 may be an anode and the second electrode EL2 may be a cathode. In an implementation, the first electrode EL1 or the second electrode EL2 may be formed of a plurality of layers. The first electrode EL1 or the second electrode EL2 may be provided using a sputtering method or a vacuum deposition method and the like.

In an implementation, when the first electrode EL1 is a transparent electrode and the second electrode EL2 is a reflective electrode, the organic light emitting device may be a bottom emission type. The organic light emitting device may be a double-sided light emitting type when both the first electrode EL1 and the second electrode EL2 are transparent electrodes, and a top emission type when the first electrode EL1 is a reflective electrode and the second electrode EL2 is a transparent electrode.

In the organic light emitting device OEL, a self-assembled monolayer SAM may be disposed on the first electrode EL1. The self-assembled monolayer SAM may be formed between the first electrode EL1 and the hole control layer HCL, and may perform the function of adjusting the arrangement of the hole control layer HCL. The arrangement relationship between the self-assembled monolayer SAM and the hole control layer HCL will be described below.

The hole control layer HCL may be disposed on the self-assembled monolayer SAM. The hole control layer HCL may be a hole transport layer. In an implementation, the hole control layer HCL may be divided into a hole injection layer and a hole transport layer. In an implementation, the hole control layer HCL may further include at least one of a buffer layer or an electron blocking layer.

The hole control layer HCL may be, e.g., a single layer formed of a single material, a single layer formed of a plurality of different materials, or have a multi-layered structure including a plurality of layers formed of a plurality of different materials.

For example, the hole control layer HCL may have the structure of a single layer formed of a plurality of different materials, or a structure in which the hole injection layer/hole transport layer, the hole injection layer/hole transport layer/buffer layer, the hole injection layer/buffer layer, the hole transport layer/buffer layer, or the hole injection layer/hole transport layer/electrode blocking layer are sequentially laminated from the first electrode EL1.

The hole control layer HCL may be formed using various methods such as a vacuum deposition method, a spin coating method, a casting method, a Langmuir-Blodgett method, an inkjet printing method, a laser printing method, or a laser induced thermal imaging (LITI) method, and the like.

When the hole control layer HCL includes the hole injection layer, the hole control layer may include, e.g., a phthalocyanine compound such as copper phthalocyanine; or n,n'-diphenyl-n,n'-bis-[4-(phenyl-m-tolyl-amino)-phenyl]-biphenyl-4,4'-diamine (DNTPD),4,4',4"-tris(3-methylphenylphenylamino) triphenylamine (m-MTDATA),4, 4'4"-tris(n, n-diphenylamino)triphenylamine (TDATA),4,4', 4"-tris{n,-(2-naphthyl)-n-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), or (polyaniline)/poly(4-styrenesulfonate) (PANI/PSS), or the like.

When the hole control layer HCL includes the hole transport layer, the hole control layer HCL may include, e.g., a carbazole-based derivative such as n-phenylcarbazole or polyvinylcarbazole; a fluorine-based derivative; a triphenylamine-based derivative such as n,n'-bis(3-methylphenyl)-n,n'-diphenyl-[1,1-biphenyl]-4,4'-diamine (TPD) or 4,4',4"-tris(n-carbazolyl)triphenylamine (TCTA); or n,n'-di (1-naphthyl)-n, n'-diphenylbenzidine (NPB), 4,4'-cyclohexylidene bis[n,n-bis(4-methylphenyl)benzenamine] (TAPC), or the like.

The thickness of the hole control layer HCL may be, e.g., about 10 nm to about 1000 nm. When the thickness of the hole control layer HCL satisfies the above range, desirable hole transport properties may be obtained without a substantial increase in driving voltage.

In addition to the materials mentioned above, the hole control layer HCL may further include, e.g., a charge generating material to help improve electrical conductivity. The charge generating material may be uniformly or non-uniformly dispersed in the hole control layer HCL. The charge generating material may be, e.g., a p-dopant. The p-dopant may be one of a quinone derivative, a metal oxide, or a cyano group-containing compound. For example, the p-dopant may be a quinone derivative such as tetracyanoquinodimethane (TCNQ) or 2,3,5,6-tetrafluoro-tetracyanoquinodimethane (F4-TCNQ), or a metal oxide such as a tungsten oxide or a molybdenum oxide.

As described above, the hole control layer HCL may further include at least one of the buffer layer or the electron blocking layer. The buffer layer may help increase light emitting efficiency by compensating for a resonance distance which depends on the wavelength of light emitted from the light emitting layer EML. A material included in the hole control layer HCL may be used as a material included in the buffer layer. The electron blocking layer is a layer having the role of helping to prevent the injection of electrons from the electron control layer ECL into the hole control layer HCL.

The light emitting layer EML may be provided on the hole control layer HCL. The light emitting layer EML may have a single-layered structure or a multi-layered structure including a plurality of layers. The light emitting layer may be formed using various methods including a vacuum deposition method, a spin coating method, a casting method, a Langmuir-Blodgett method, an inkjet printing method, a laser printing method, or a laser induced thermal imaging (LITI) method, and the like.

The light emitting layer EML may be formed of at least one host material and at least one dopant material. The dopant included in the light emitting layer EML may be a red, green, or blue dopant.

In an implementation, $Bt_2Ir(acac)$ or $Ir(piq)_3$ and the like may be used as the red dopant. In an implementation, $Ir(ppy)_3$, $Ir(ppy)_2(acac)$, or $Ir(mppy)_3$ and the like may be used as the green dopant, while Flrpic or DPAVBi and the like may be used as the blue dopant. CBP, mCP, TCTA, TPBI, or Alq$_3$ and the like may be used as the host material. In an implementation, the light emitting layer EML may be provided to a thickness of about 5 nm to about 100 nm.

The electron control layer ECL may be disposed on the light emitting layer EML. In an implementation, the electron control layer ECL may include an electron transport layer and an electron injection layer. In an implementation, the electron control layer ECL may further include a hole blocking layer.

For example, the electron control layer ECL may have a structure in which the electron transport layer/electron injection layer or the hole blocking layer/electron transport layer/electron injection layer are sequentially laminated from the light emitting layer EML, or have a single-layered structure in which at least two of such layers are mixed.

The electron control layer ECL may be formed using various methods such as a vacuum deposition method, a spin coating method, a casting method, a Langmuir-Blodgett method, an inkjet printing method, a laser printing method, or a laser induced thermal imaging (LITI) method, and the like.

When the electron control layer ECL includes the electron transport layer, the electron control layer may include, e.g., tris(8-hydroxyquinolinato)aluminum (Alq3), 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4h-1,2,4-triazole (NTAZ), 2-(4-biphenylyl)-5-(4-tert-butylphenyl)-1,3,4-oxadiazole (tBu-PBD), bis(2-methyl-8-quinolinolato-n1,o8)-(1,1'-biphenyl-4-olato)aluminum (BAlq), berylliumbis(benzoquinolin-10-olate) (Bebq2), 9,10-di(naphthalene-2-yl)anthracene (ADN), or mixtures thereof. The thickness of the electron transport layer may be about 10 nm to about 100 nm, e.g., about 15 nm to about 50 nm. When the thickness of the electron transport layer satisfies the above range, desirable electron transport properties may be obtained without a substantial increase in driving voltage.

When the electron control layer ECL includes the electron injection layer, e.g., lithium fluoride (LiF), lithium quinolate (LiQ), lithium oxide (Li$_2$O), barium oxide (BaO), sodium chloride (NaCl), cesium fluoride (CsF), a lanthanum group metal such as ytterbium (Yb), or a halogenated metal such as rubidium chloride (RbCl) or rubidium iodide (RbI) and the like may be used in the electron control layer ECL. In an implementation, the electron injection layer may be formed of a material in which an electron transport material is mixed with an electrically insulative organo metal salt. The organo metal salt may be a material having an energy band gap of at least about 4 eV. In an implementation, the organo metal salt may include metal acetate, metal benzoate, metal acetoacetate, metal acetylacetonate, or metal stearate. The thickness of the electron injection layer may be about 0.1 nm to about 10 nm, or about 0.3 nm to about 9 nm. When the thickness of the electron injection layer satisfies the above range, desirable electron injection properties may be obtained without a substantial increase in driving voltage.

As described above, the electron control layer ECL may include the hole blocking layer. The hole blocking layer may include, e.g., at least one of 2,9-dimethyl-4,7-diphenyl-1,10-phenanthroline (BCP) or 4,7-diphenyl-1,10-phenanthroline (Bphen). The thickness of the hole blocking layer may be about 2 nm to about 100 nm, e.g., about 3 nm to about 30 nm. When the thickness of the hole blocking layer satisfies the above range, excellent hole blocking properties may be obtained without a substantial increase in driving voltage.

Figure 2:
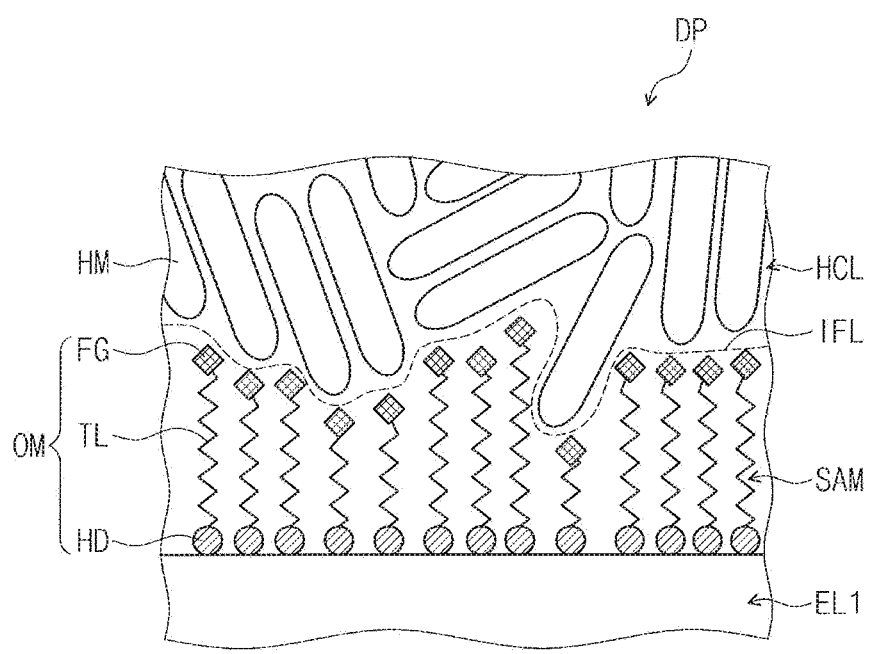
FIG. 2 illustrates an expanded view of a self-assembled monolayer in the cross-sectional view of the organic light emitting device of FIG. 1.
Figure 3A:
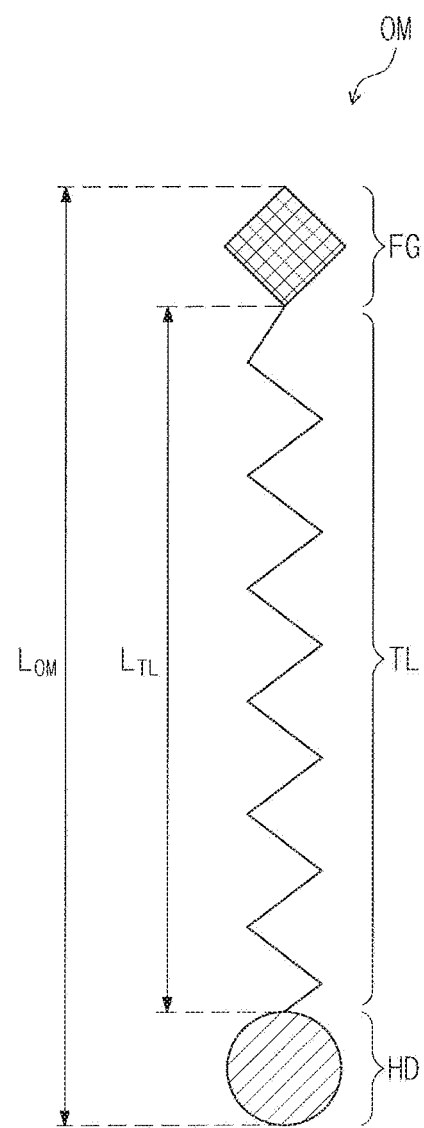
FIG. 3A schematically illustrates an organic molecule according to an embodiment.
Figure 3B:
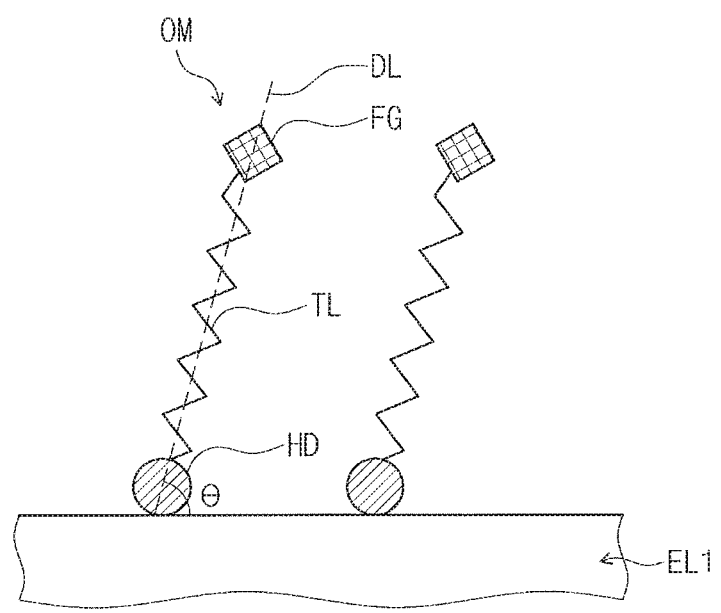
FIG. 3B schematically illustrates the arrangement of a plurality of organic molecules according to an embodiment.

FIG. 2 illustrates an expanded view of DP in the cross-sectional view of the organic light emitting device OEL illustrated in FIG. 1, wherein DP is a region that includes a portion of the self-assembled monolayer SAM, and the hole control layer HCL and first electrode EL1 sandwiching this portion of the self-assembled monolayer SAM. FIG. 3A schematically illustrates the structure of one organic molecule OM among a plurality of organic molecules forming a self-assembled monolayer. FIG. 3B schematically illustrates an embodiment in which the plurality of organic molecules OM are disposed on the first electrode EL1.

Referring to FIG. 2, the self-assembled monolayer SAM may include the plurality of organic molecules OM. The plurality of organic molecules OM may form a single layer on the first electrode EL1. For example, the self-assembled monolayer SAM may be a single molecular layer formed of the plurality of organic molecules OM. In an implementation, the self-assembled monolayer SAM may be a single layer of the plurality of organic molecules OM arranged on the first electrode EL1 or may include two or three layers formed by laminating the plurality of organic molecules OM.

Each of the plurality of organic molecules OM forming the self-assembled monolayer SAM may include a head part or head HD, a tail part or tail TL, and a terminal end part or terminal end FG. The plurality of organic molecules OM may be disposed such that each of the heads HD is bonded to the first electrode EL1 and each of the terminal ends FG is adjacent to the hole control layer HCL. The tail TL may be a part connecting between the head HD with the terminal end FG.

In an embodiment, the self-assembled monolayer SAM may include the plurality of organic molecules OM represented by Formula 1, below. In an implementation, in Formula 1, X may be, e.g., a phosphonic acid group or moiety or a silane group or moiety, Y may be, e.g., hydrogen, a substituted or unsubstituted alkyl group or moiety having 1 to 5 carbon atoms, or a substituted or unsubstituted aromatic group or moiety having 6 to 30 ring carbon atoms, and n may be an integer of, e.g., 2 to 20.

[Formula 1]

In Formula 1, "substituted" indicates that at least one hydrogen atom in a functional group is substituted or replaced with at least one type of substituent selected from the group containing halogen atoms (F, Br, Cl, or I), hydroxy groups, thiol groups, nitro groups, cyano groups, amino groups, amidino groups, hydrazine groups, hydrazone groups, carboxyl groups, substituted or unsubstituted alkoxy groups, substituted or unsubstituted thioether groups (SR$_{10}$, where R$_{10}$ is a C1 to C10 alkyl group), substituted or unsubstituted sulfone groups (SO$_2$R$_{11}$, where R$_{11}$ is a C1 to C10 alkyl group), substituted or unsubstituted alkyl groups, substituted or unsubstituted alkenyl groups, substituted or unsubstituted alkynyl groups, substituted or unsubstituted cycloalkyl groups, substituted or unsubstituted cycloalkenyl groups, substituted or unsubstituted cycloalkynyl groups, substituted or unsubstituted aryl groups, and substituted or unsubstituted hetero-ring groups.

In the plurality of organic molecules OM, each of the heads HD may chemically bond with the first electrode EL1.

The head HD may be or may include, e.g., a phosphonic acid or silane. In an implementation, the head HD may include other reactive groups capable of forming a chemical bond with the first electrode EL1. For example, the head HD may form a covalent bond with a conductive material in the first electrode EL1. The head HD may be a part corresponding to X in Formula 1. For example, X in Formula 1 may be a part that bonds with the first electrode EL1. For example, the group or moiety of the head HD may be a group or moiety that is in a bound state with the first electrode EL1.

In an implementation, the tail TL may be a connecting part that connects the head HD with the terminal end FG. The tail TL may be, e.g., an alkylene group, and may be the part corresponding to

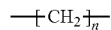

in Formula 1. A length of the organic molecule OM may be adjusted by adjusting the length of the tail TL. For example, the length of the organic molecule OM may be adjusted by adjusting the length of an alkylene group which is the tail TL. In an implementation, the length of the organic molecule OM may be adjusted by changing the integer n in Formula 1.

In an implementation, at least one of the hydrogen atoms in the alkylene group in the tail TL may be substituted or replaced with a halogen atom. In an implementation, at least one of the hydrogen atoms in

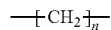

may be substituted with fluorine (F).

The terminal end FG may correspond to a functional group interacting with other layers disposed on the self-assembled monolayer SAM. In an implementation, the terminal end FG may be or include, e.g., an aromatic group. In an implementation, the terminal end FG may be or include, e.g., one of a phenyl group, a naphthalene group, or an anthracene group. In an implementation, Y in Formula 1 may correspond to the terminal end FG of the organic molecule.

The self-assembled monolayer SAM may be formed on the first electrode EL1 using, e.g., a deposition method. In an implementation, the self-assembled monolayer SAM may be formed by, e.g., coating the first electrode EL1 with a solution prepared so as to include the plurality of organic molecules OM.

In an embodiment, at least two of the plurality of organic molecules OM included in the self-assembled monolayer SAM may have tails TL of different lengths from each other. The self-assembled monolayer SAM may include the plurality of organic molecules OM having tails TL of different lengths from each other. In an implementation, the plurality of organic molecules OM forming the self-assembled monolayer SAM may include, e.g., two classes of organic molecules OM having tails TL of different lengths from each other, or three classes of organic molecules OM having tails TL of different lengths from each other. In an implementation, the self-assembled monolayer SAM may also be formed of a plurality of organic molecules OM of various lengths.

In the plurality of organic molecules OM, a carbon number (e.g., number of chain carbons) of an alkylene group in one of the tails TL may differ from a carbon number of an alkylene group in another one of the tails TL. In an implementation, the self-assembled monolayer SAM may include the plurality of organic molecules OM having different integer values of n in Formula 1.

In an implementation, the plurality of organic molecules represented by Formula 1 may include at least one of a first organic molecule in which n=n1 and at least one of a second organic molecule in which n=n2. In an implementation, n1 and n2 may be different integers from each other.

In an implementation, the thickness of the self-assembled monolayer SAM may be, e.g., about 2 nm to about 3 nm. It is noted that such thicknesses are average thicknesses of the self-assembled monolayer SAM, and the self-assembled monolayer SAM may have portions of differing thickness. For example, portions of the self-assembled monolayer SAM may be formed to be less than 2 nm thick or more than 3 nm thick.

The thickness of the self-assembled monolayer SAM may be determined according to the length of the plurality of organic molecules OM arranged on the first electrode EL1. Referring to FIG. 3A, the total length LOM of the organic molecule OM is the length including the head HD, the tail TL, and the terminal end FG. Thus, as described above, the length LOM of the organic molecule may be mostly adjusted by adjusting the length LTL of the tail TL. The length of the plurality of organic molecules OM may be adjusted by adjusting the length of each of the tails TL, and the thickness of the self-assembled monolayer SAM may change according to the length of the tail of the plurality of organic molecules OM arranged on the first electrode EL1.

FIG. 3B exemplarily illustrates how the plurality of organic molecules OM are arranged by being bonded on the first electrode EL1. In an implementation, the plurality of organic molecules OM may form a predetermined angle with the first electrode EL1 and may be arranged on the first electrode EL1. When 6 is the angle between an imaginary line DL extending in the direction of the organic molecule OM and the face of the first electrode EL1, 6 may be at least 60 degrees. For example, 6 may be 90 degrees. When 6 is 90 degrees, the self-assembled monolayer SAM may be formed by disposing the plurality of organic molecules OM such that the tails TL are perpendicular or orthogonal to a surface of the first electrode E1.

The self-assembled monolayer SAM may be formed on the first electrode EL1 and may modify the surface properties of the first electrode EL1. The self-assembled monolayer SAM may be between the first electrode EL1 and an organic film layer, and may help adjust the arrangement of the organic film layer on the first electrode EL1.

In an implementation, the self-assembled monolayer SAM may be between the first electrode EL1 and the hole control layer HCL and may help adjust the arrangement of the hole control layer HCL. For example, the self-assembled monolayer SAM may perform an alignment function for adjusting the arrangement of the hole control layer HCL through physical or chemical actions.

For example, the self-assembled monolayer may help arrange an organic compound in the hole control layer HCL by providing physical ridges and valleys formed by the plurality of organic molecules OM having different lengths. In an implementation, the self-assembled monolayer SAM may include the plurality of organic molecules OM, which are chemically bonded with the organic compound in the hole control layer HCL, and arrange the organic compound in the hole control layer HCL.

As illustrated in FIG. 2, in an embodiment, the plurality of organic molecules OM having tails TL of different lengths may be arranged on the first electrode EL1, and an interface IFL between the self-assembled monolayer SAM and the hole control layer HCL may have curves.

The self-assembled monolayer SAM may include the plurality of organic molecules OM having different lengths, and the surface of the self-assembled monolayer SAM may have fine ridges and valleys. For example, the plurality of organic molecules OM having different lengths may be randomly arranged on the first electrode EL1 such that the trajectory of the interface IFL, which is an imaginary line connecting the tails of the plurality of organic molecules OM, is not flat but has curves in accordance with the differences in length amongst the organic molecules OM arranged on the first electrode EL1.

In an implementation, the formation of physical ridges and valleys in the interface IFL between the self-assembled monolayer SAM and the hole control layer HCL may become easier as the differences in length amongst the tails TL becomes larger in the self-assembled monolayer SAM formed of the plurality of organic molecules OM having tails TL of different lengths.

For example, when the self-assembled monolayer SAM includes the plurality of organic molecules represented by Formula 1, the self-assembled monolayer SAM may include at least one of the first organic molecule in which n=n1 and at least one of the second organic molecule in which n=n2. In an implementation, n1 and n2 are different integers, and the difference between n1 and n2 may be at least 10. When the difference between n1 and n2 is at least 10, randomly arranged pluralities of the first organic molecules and the second organic molecules may easily form physical ridges and valleys on the surface of the self-assembled monolayer, and thus the interface between the self-assembled monolayer and the hole control layer may be formed to include a large number of physical ridges and valleys. Accordingly, the physical ridges and valleys formed due to the differences in length amongst the tails may cause the molecules in the hole control layer to be randomly arranged on the self-assembled monolayer.

In an implementation, the plurality of organic molecules OM forming the self-assembled monolayer SAM may include, e.g., 8-alkylphosphonic acid and 18-alkylphosphonic acid. In an implementation, the self-assembled monolayer SAM may include the plurality of organic molecules represented by Formula 1 and having alkylene groups of different carbon numbers.

The surface of the self-assembled monolayer SAM may have curves, and the hole control layer HCL on the self-assembled monolayer SAM may be disposed along the curves provided by the self-assembled monolayer SAM.

In an implementation, the hole control layer HCL may include an anisotropic compound HM. For example, the anisotropic compound HM included in the hole control layer HCL may be randomly arranged along the physical ridges and valleys on the surface of the self-assembled monolayer SAM.

Figure 4:
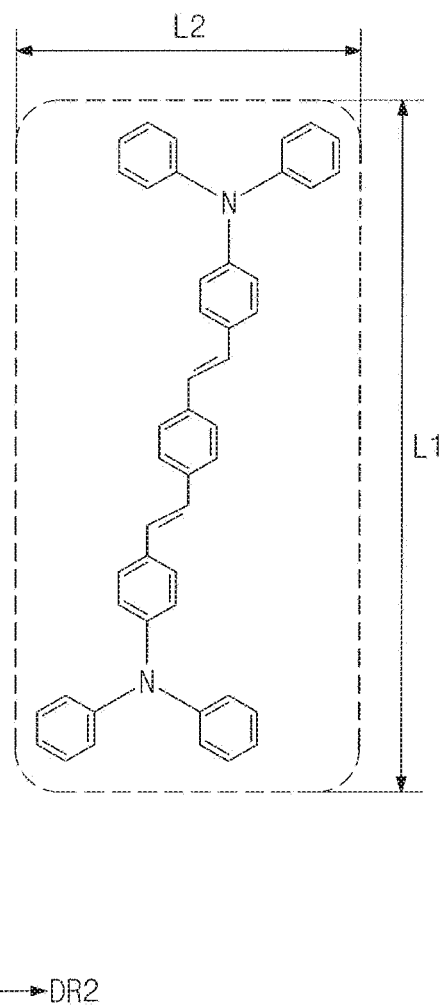
FIG. 4 exemplarily illustrates an anisotropic compound included in a hole control layer according to an embodiment.
Figure 5A:
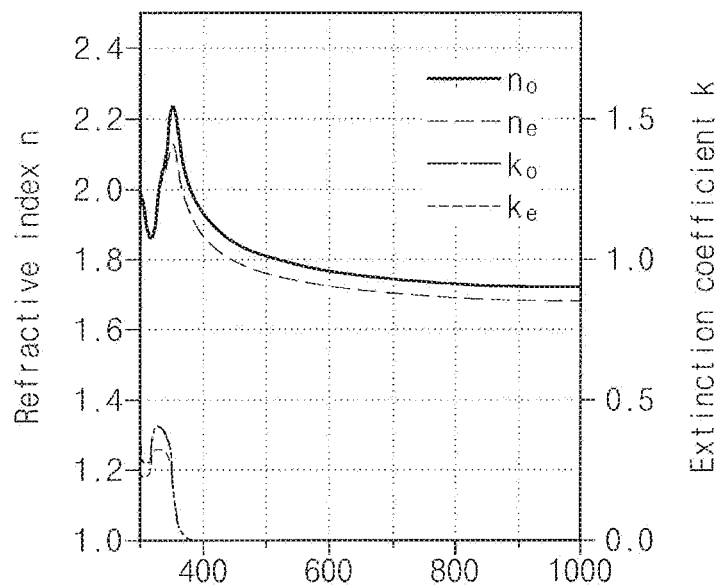
FIGS. 5A to 5D illustrate graphs showing the results of measuring the optical properties of an anisotropic compound.
Figure 5B:
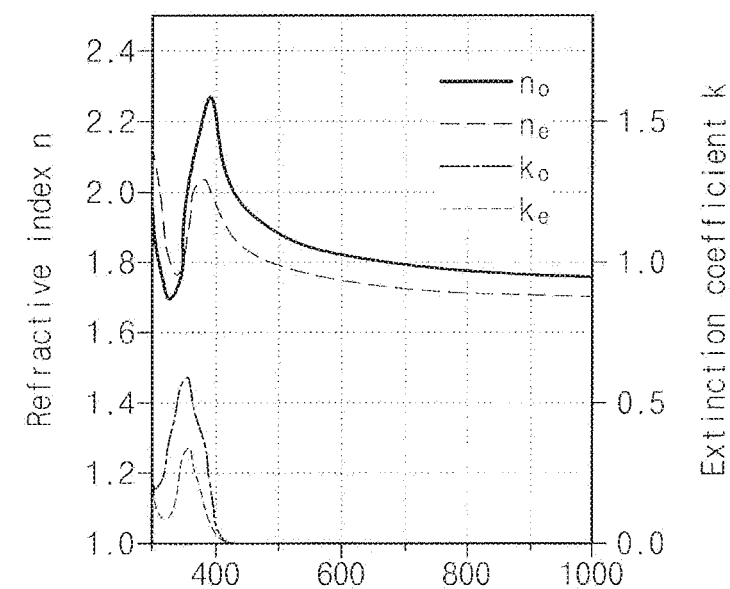
Figure 5C:
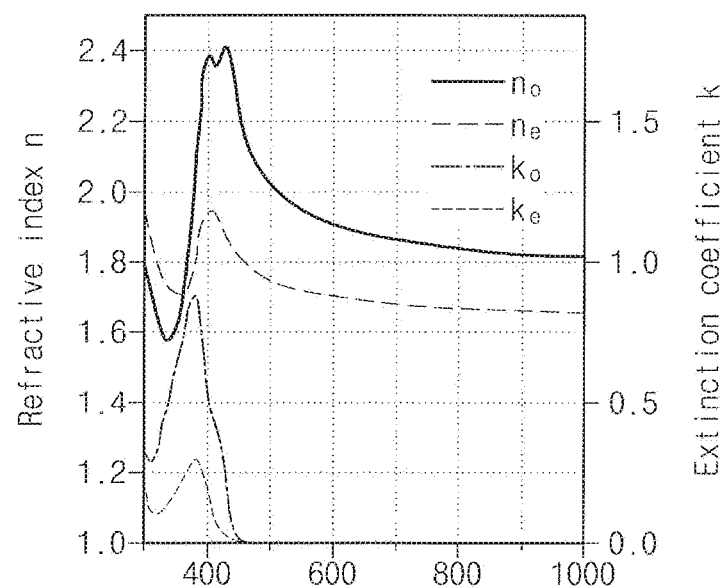
Figure 5D:
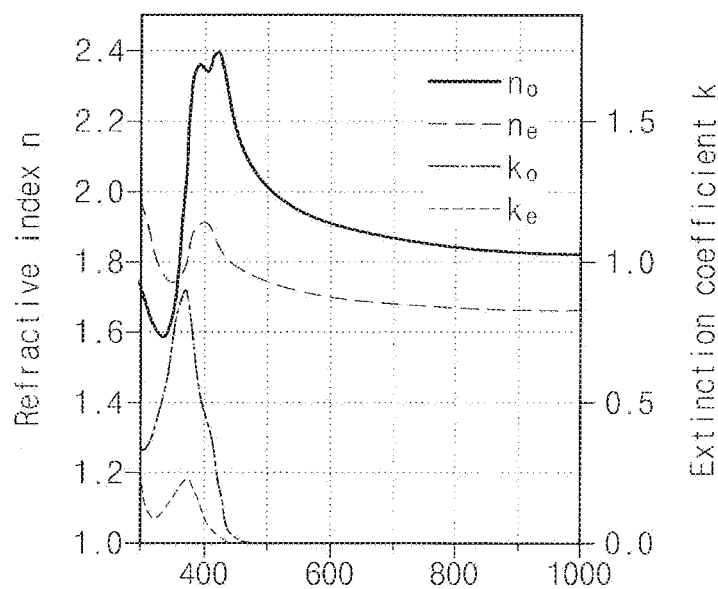

FIG. 4 exemplarily illustrates the anisotropic compound HM according to an embodiment. The length L1 in which the anisotropic compound HM is extended in one direction (e.g., DR1) may be longer than the length L2 in which the anisotropic compound HM is extended in another direction (e.g., DR2) perpendicular to the one direction. For example, the anisotropic compound HM may be a hole transport material in which the length L1 in a long axis direction (aligned with the one direction) differs from the length L2 in a short axis direction (aligned with the other direction).

Examples of the anisotropic compound HM included in the hole control layer HCL are shown below. In an implementation, the hole control layer HCL may include any one of Compounds 1 to 8, below.

1

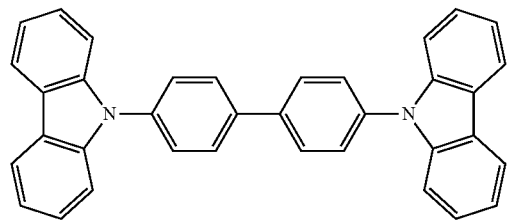

2

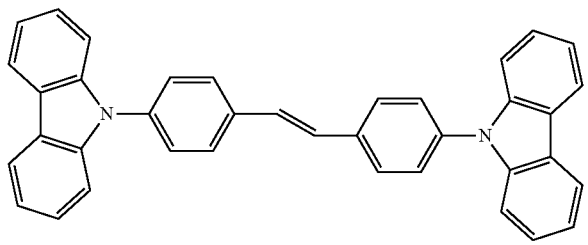

3

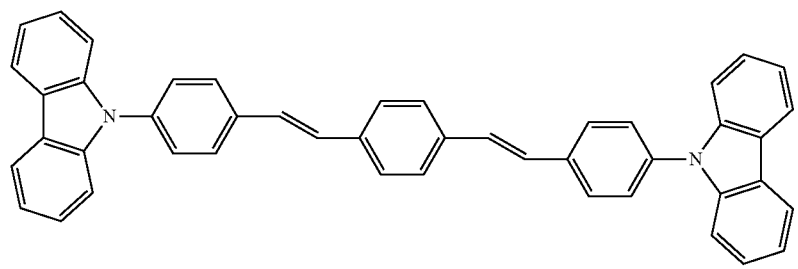

-continued

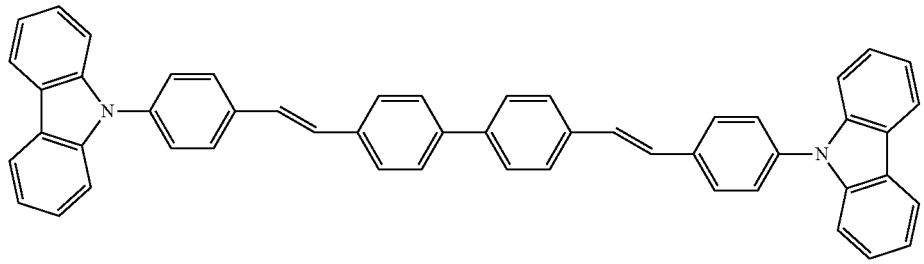

4

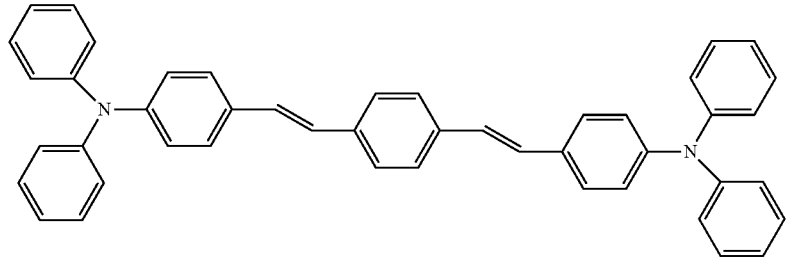

5

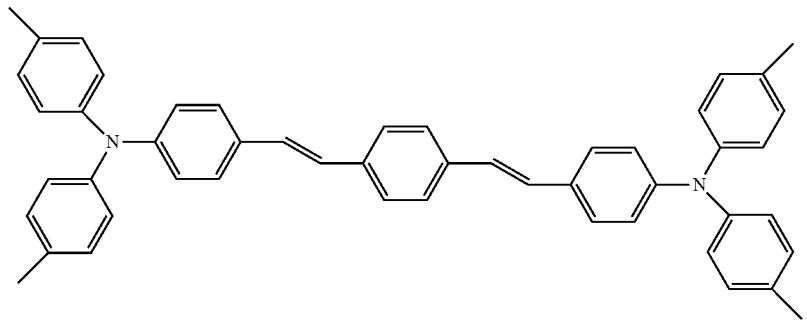

6

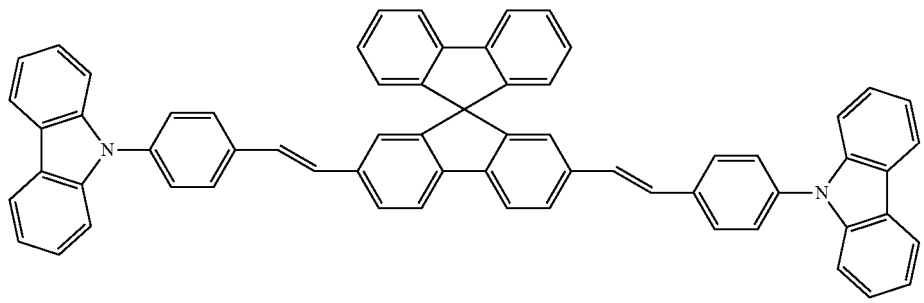

7

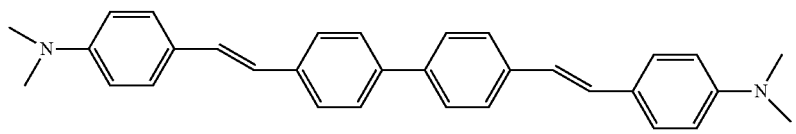

8

FIGS. 5A to 5D illustrate graphs showing the refractive indices and extinction coefficients of the anisotropic compounds HM above. FIGS. 5A, 5B, 5C, and 5D illustrate graphs showing the refractive index and extinction coefficient of Compound 2, 3, 4, and 5, respectively. Here, $n_o$ and $k_o$ respectively indicate the refractive index and extinction coefficient in the horizontal axis direction, and $n_e$ and $k_e$ respectively indicate the refractive index and extinction coefficient in the vertical axis direction.

Referring to FIGS. 5A to 5D, it may be seen that $n_o > n_e$ and $k_o > k_e$. Therefore, it may be seen from the graphs in FIGS. 5A to 5D that the anisotropic compound HM included in the hole control layer HCL is optically anisotropic.

In addition, it may be seen that the difference between $n_o$ and $n_e$ and between $k_o$ and $k_e$ increases going from FIG. 5A to FIG. 5D. For example, it may be seen that the optical properties of the hole control layer HCL may change according to the shape of the anisotropic compound HM, and that the difference between the wavelength dependent values of $n_o$ and $n_e$ increases and optical anisotropy increases as the length in the long axis direction of the molecules becomes relatively longer.

Figure 6:
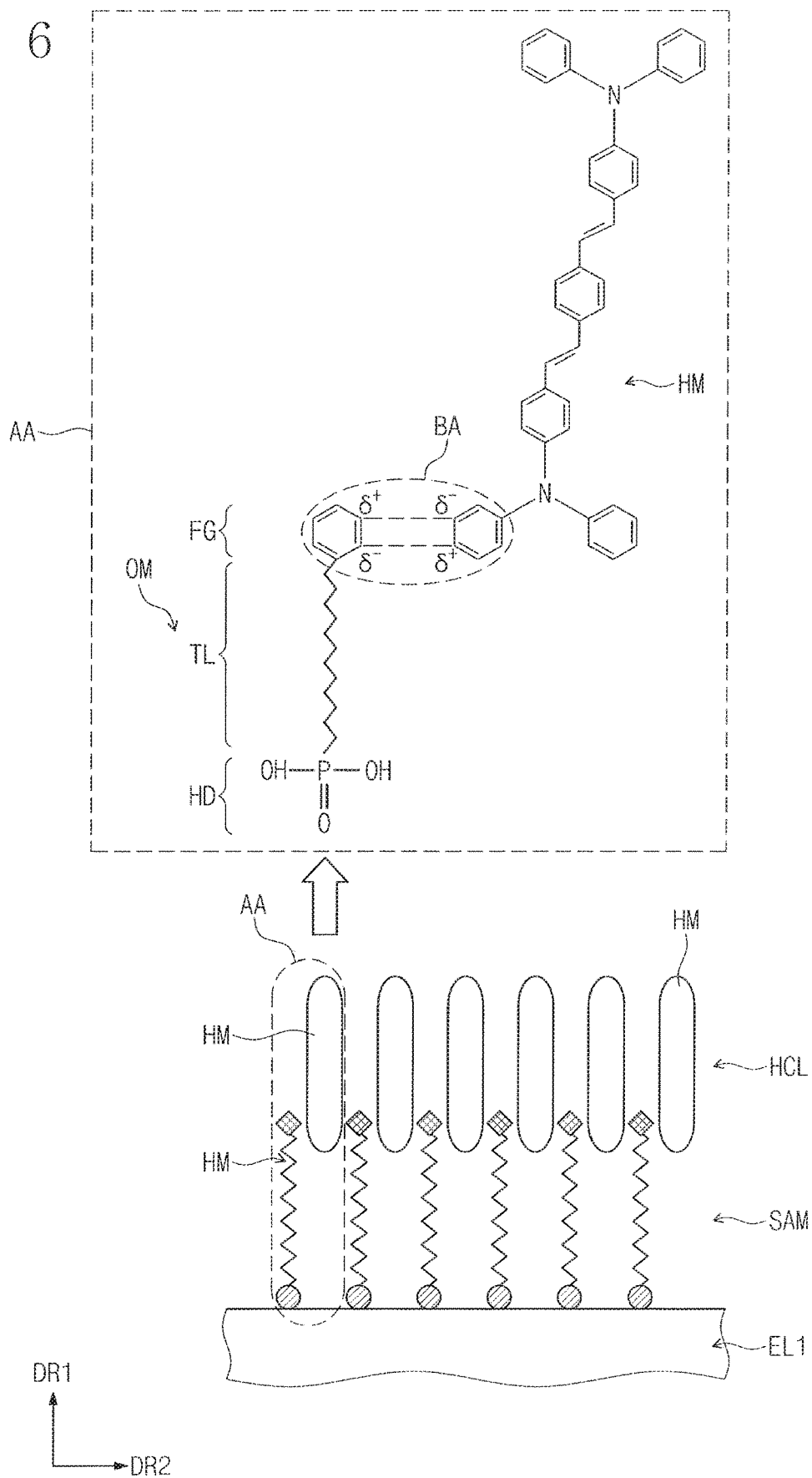
FIG. 6 schematically illustrates the bonding relationship between a compound in a hole layer and an organic molecule according to an embodiment.

FIG. 6 illustrates an expanded view of the organic light emitting device according to an embodiment the first electrode EL1, the self-assembled monolayer SAM on the first electrode EL1, and the hole control layer HCL on the self-assembled monolayer SAM. In FIG. 6, AA is a portion exemplary illustrating the bonding relationship between one of the organic molecules OM in the self-assembled monolayer SAM and one of the anisotropic compounds HM in the hole control layer HCL. For example, in the organic molecule OM in FIG. 6, phosphonic acid may be at the head HD, the terminal end FG may have a phenyl group, and the tail TL may correspond to an alkylene group. The anisotropic compound HM may be an amine compound having two phenyl groups at a terminal end thereof.

In an embodiment, the anisotropic compound HM in the hole control layer HCL may be arranged such that the long axis is perpendicular or orthogonal to the surface of the first electrode EL1. For example, the anisotropic compound HM may be arranged such that the long axis, along which the length of the molecule is longer, is aligned with the first direction DR1, which is the thickness direction of the display device.

BA in FIG. 6 schematically illustrates the bonding relationship between the anisotropic compound HM and the organic molecule OM. For example, in BA, the anisotropic compound HM in the hole control layer HCL may undergo a chemical interaction with the terminal end FG of the organic molecule OM forming the self-assembling monolayer SAM. For example, in the embodiment illustrated in FIG. 6, a phenyl group, which is the terminal end FG in the organic molecule OM, may bond with one of the phenyl groups in an amine group in the anisotropic compound HM. For example, the oppositely polarized phenyl groups in the terminal end of the organic molecule and the amine group respectively, may be bonded with each by molecular interactions. For example, a dipole-dipole interaction, hydrogen bond, van der Waals force, or other intermolecular force may form the bond or attraction between the terminal end of the organic molecule and the anisotropic compound.

In an implementation, the anisotropic compound may be arranged orthogonal to the surface of the first electrode EL1 due to the interaction between the end group in the anisotropic compound HM included in the hole control layer HCL and the terminal end FG of the plurality of organic molecules OM forming the self-assembled monolayer SAM. For example, the terminal end of the organic molecule and the anisotropic compound may be arranged through n-n stacking due to molecular interactions.

In an implementation, the lengths of the tails TL of the plurality of organic molecules OM arranged on the first electrode EL1 may all be identical. In an implementation, the self-assembled monolayer SAM may include at least two of the plurality of organic molecules OM having tails TL of different lengths.

In the embodiment in FIG. 6, the anisotropic compound HM in the hole control layer HCL may bond with the organic molecules OM in the self-assembled monolayer SAM and be arranged orthogonal to the surface of the first electrode EL1.

FIG. 6 illustrates only the areas of the hole control layer HCL close to the self-assembled monolayer SAM, and the arrangement of the anisotropic compound HM in the remaining other areas of the hole control layer HCL may differ from the arrangement of the anisotropic compound HM disposed close to the self-assembled monolayer SAM. For example, the greater the distance from the self-assembled monolayer SAM, the less the predetermined angle between the anisotropic compounds HM and the first electrode EL1 may be maintained and the more random the arrangement of the anisotropic compounds HM.

Figure 7A:
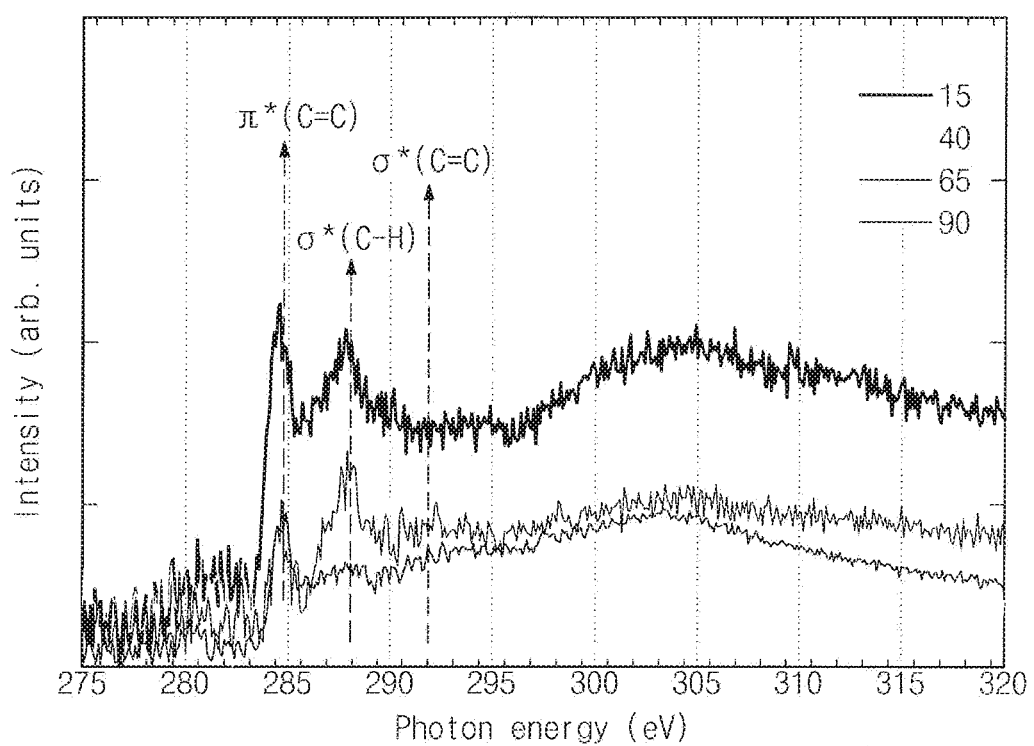
FIG. 7A illustrates x-ray analysis results of an organic light emitting device in which a self-assembled monolayer is omitted.
Figure 7B:
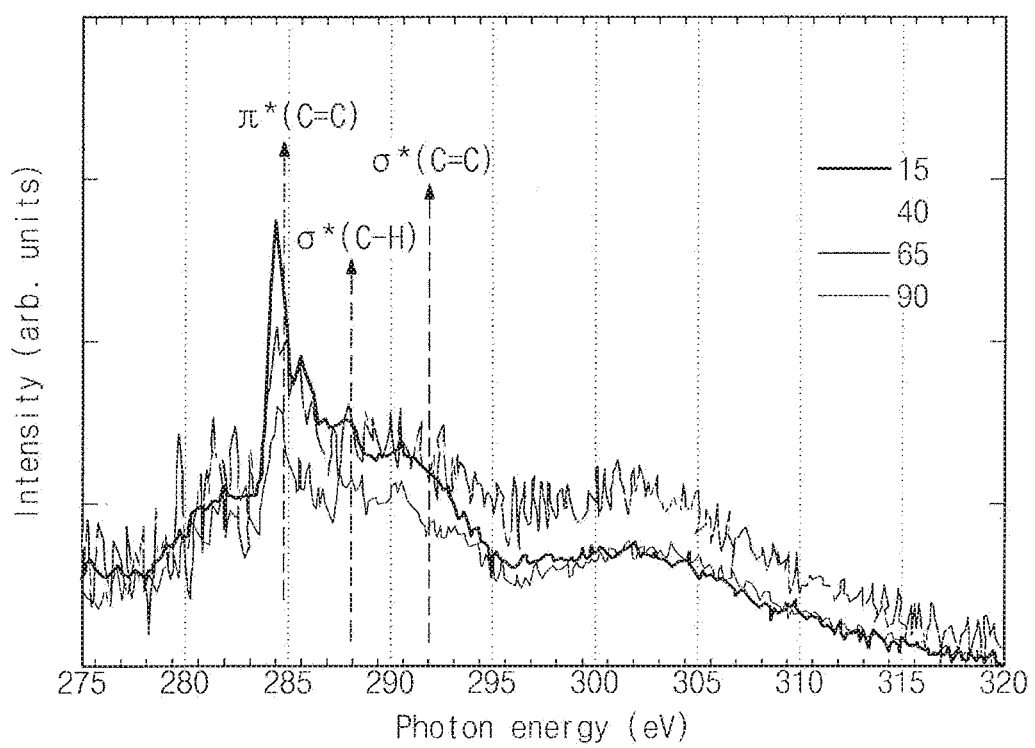
FIG. 7B illustrates x-ray analysis results of an organic light emitting device including a self-assembled monolayer according to an embodiment.

FIG. 7A illustrates x-ray test results for verifying the arrangement of anisotropic molecules in a hole control layer in an organic light emitting device in which the self-assembled monolayer was omitted. FIG. 7B illustrates x-ray test results verifying the arrangement of the anisotropic molecules in the hole control layer of the organic light emitting device in an embodiment. The test results in FIGS. 7A and 7B are results obtained using near edge x-ray absorption fine structure (NEXAFS).

FIGS. 7A and 7B compare absorption spectrum measurements according to the incidence angle of x-rays. FIG. 7A shows an absorption spectrum for the case in which a hole control layer is formed directly on a first electrode. FIG. 7B shows an absorption spectrum for an organic light emitting device, for the case in which a self-assembled monolayer is disposed on a first electrode, and a hole control layer is disposed on the self-assembled monolayer. As in the embodiment in FIG. 2, the embodiment in FIG. 7B may exemplify a case in which a plurality of organic molecules having different lengths form the self-assembled monolayer.

FIGS. 7A and 7B respectively illustrate the results of measuring the arrangement of anisotropic compounds in a hole control layer for the case in which the hole control layer is disposed directly on a first electrode and the case in which a self-assembled monolayer is disposed between a first electrode and the hole control layer. In the spectrum data of FIGS. 7A and 7B, $\pi^*(C\!=\!C)$, $\sigma^*(C\!=\!C)$, and $\sigma^*(C\!-\!H)$ respectively indicate the bonding relationships in an aromatic ring.

In the case of FIG. 7A, the peaks indicating the respective bonding relationships changed according to the angle, and in the case of FIG. 7B, the degree of change according to the angle in the peaks indicating the respective bonding relationships was smaller than in the case of FIG. 7A. For example, the change according to the angle may be large when the hole control layer is disposed directly on the first electrode, and it may be seen that the anisotropic compound is arranged in a predetermined direction. For example, in the case of FIG. 7A, the long axis of the anisotropic compound may be arranged parallel to the first electrode. In comparison, in the case of FIG. 7B, the change in the spectrum according to the angle may not be large, and it may be seen that the anisotropic compound is randomly arranged.

An embodiment may include the self-assembled monolayer and thus may reduce the color deviation due to viewing angle. For example, when the color deviation due to viewing angle in the organic light emitting device in which the hole control layer having the anisotropic compound is disposed directly on the first electrode is set as 100%, the color deviation due to viewing angle may be reduced to about 82% to about 86% in cases like the embodiment in which the self-assembled monolayer is between the hole control layer and the first electrode.

A change in the wavelength of light according to the change in the viewing angle may follow the formula below. Here, $\lambda(\theta)$ indicates the wavelength according to the viewing angle, $n(\theta)$ indicates the refractive index according to the viewing angle, and $L \cos \theta$ indicates the path length of the light according to the viewing angle.

$$\lambda(\theta) \propto n(\theta) \times L \cos \theta$$

When the hole control layer is on the self-assembled monolayer, the degree to which the wavelength changes according to the viewing angle may be reduced by making it so that the anisotropic compound forming the hole control layer is randomly arranged on the self-assembled monolayer or arranged in a direction orthogonal to the surface of the first electrode.

For example, according to the above relationship, even though L cos θ decreases towards the side viewing angles, when the anisotropic compound is arranged so as to be vertically oriented, the refractive angle may increase according to the viewing angle. Consequently the shift to lower wavelengths resulting from the decrease in L cos θ may be offset. Therefore, by using, as in the embodiment, the self-assembled monolayer to randomly or vertically arrange the anisotropic compound, the deviation in color according to the change in viewing angle may be reduced compared to the case in which the absence of the self-assembled monolayer results in a horizontal arrangement of the anisotropic compound. The organic light emitting device according to an embodiment may include the self-assembled monolayer and thus be capable of randomly arranging the organic compound molecules in the hole control layer, and the color deviation due to the viewing angle may be limited. In an implementation, by including the self-assembled monolayer having an aromatic group at an end group, the organic light emitting device according to an embodiment may arrange the organic compound molecules in the hole control layer perpendicular to the first electrode and thereby limit the color deviation due to viewing angle.

Techniques, other than those adopting the self-assembled monolayer, for improving viewing angle-dependent optical properties, such as methods for changing the light path by forming physical ridges and valleys or through light scattering may have an effect on the frontal brightness or color coordinates of an organic light emitting device. Moreover, the reflectance due to external light may also increase. In contrast, in an embodiment, the refractive index at the sides may be compensated by using the self-assembled monolayer to adjust the arrangement of the hole control layer molecules, and changes to the optical properties, such as to the frontal brightness or color coordinates, may be prevented. In an implementation, the reflectance may not be increased by external light.

Hereinafter, a display device according to an embodiment which includes the above-described organic light emitting device according to an embodiment will be described with reference to FIGS. 8 to 11.

Figure 8:
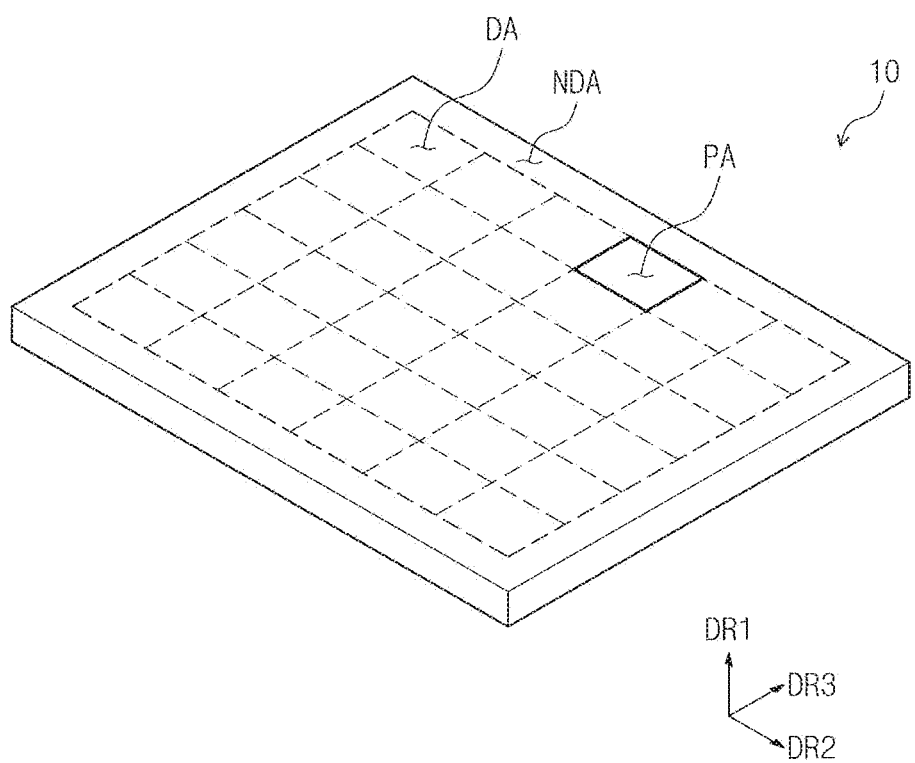
FIG. 8 illustrates a perspective view of a display device according to an embodiment.

FIG. 8 illustrates a perspective view of a display device according to an embodiment. Referring to FIG. 8, a display device 10 may include a display area DA and a non-display area NDA.

The display area DA displays an image. When viewed from a first direction DR1, which is the thickness direction of the display device 10, the display area DA may have an approximately rectangular shape.

The display area DA includes a plurality of pixel areas PA. The pixel areas PA may be arranged as a matrix. The pixel areas PA may be defined by a pixel defining film (PDL in FIG. 11). The pixel areas PA may include each of a plurality of pixels (PX in FIG. 9).

The non-display area NDA does not display an image. When viewed from the thickness direction DR1 of the display device 10, the non-display area NDA may, for example, surround the display area DA. The non-display area NDA may be adjacent to the display area DA in a second direction (for example, DR2) and a third direction (for example, DR3) which intersects the second direction.

Figure 9:
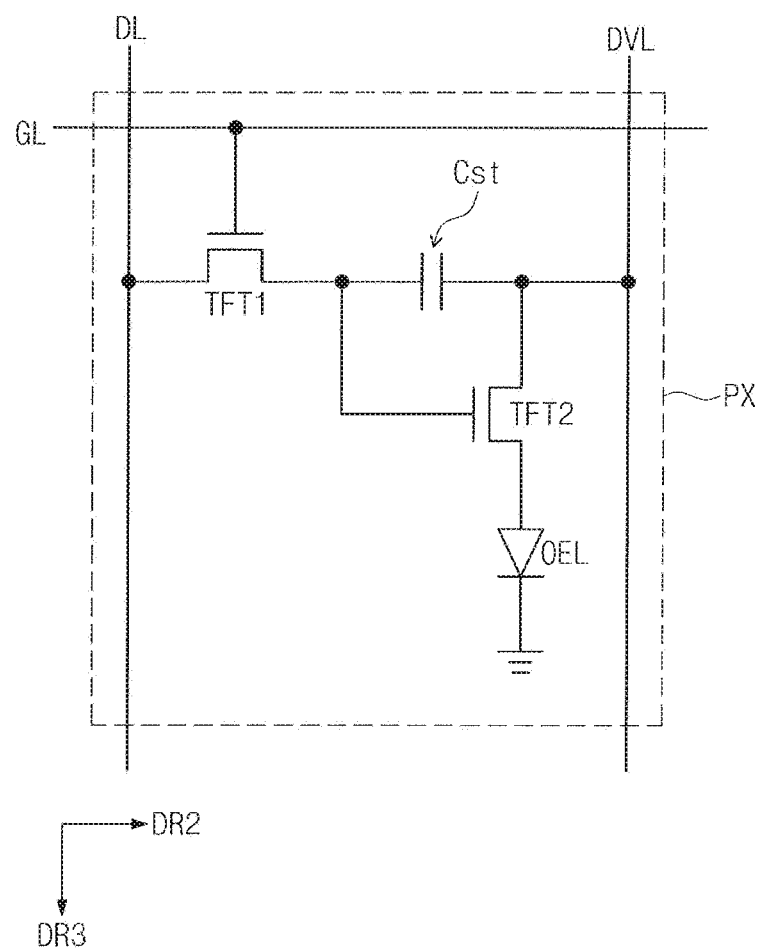
FIG. 9 illustrates a circuit diagram of a pixel included in a display device according to an embodiment.

FIG. 9 illustrates a circuit diagram of one of the pixels included in the display device according to an embodiment.

Figure 10:
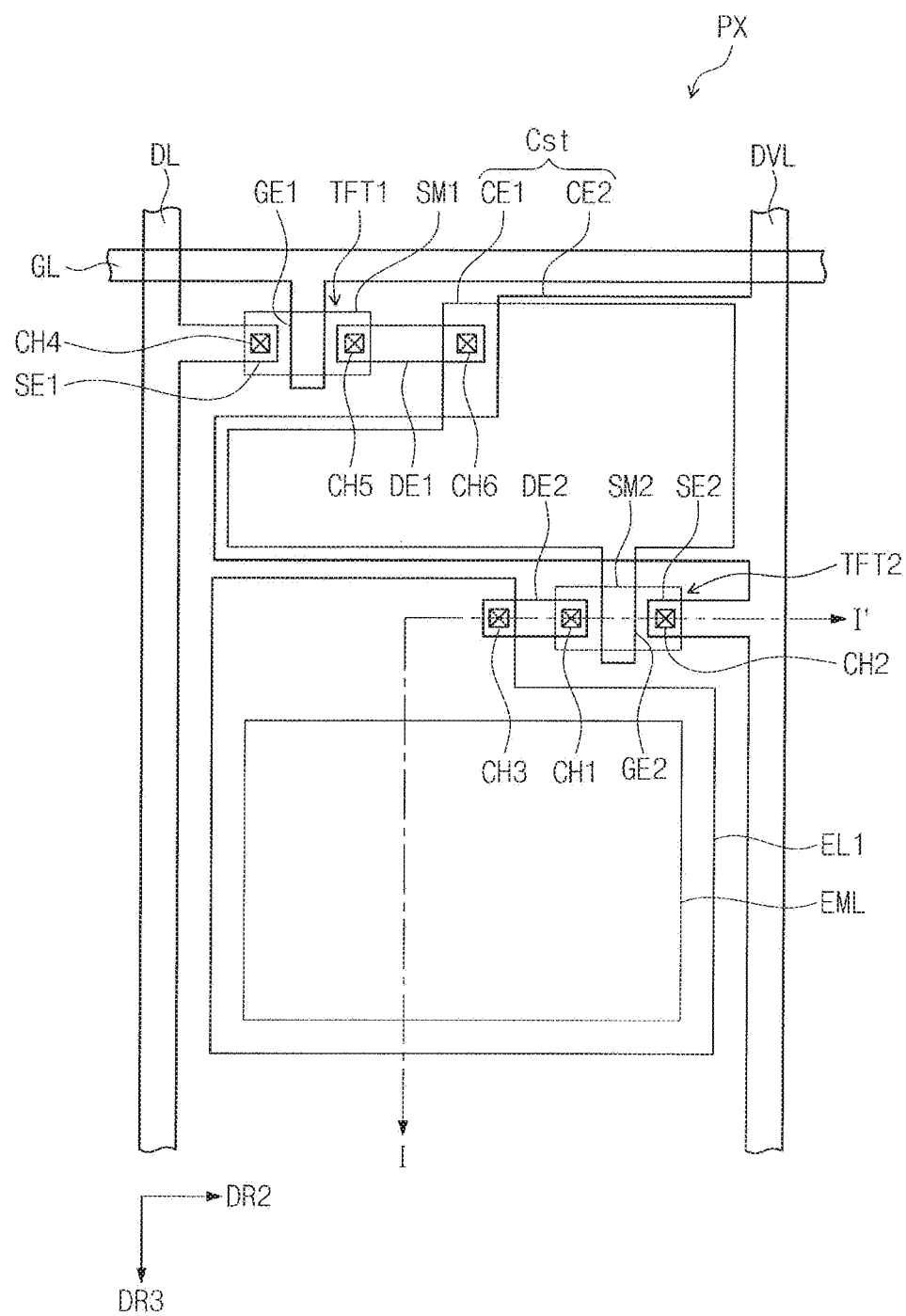
FIG. 10 illustrates a plan view of a pixel included in a display device according to an embodiment.
Figure 11:
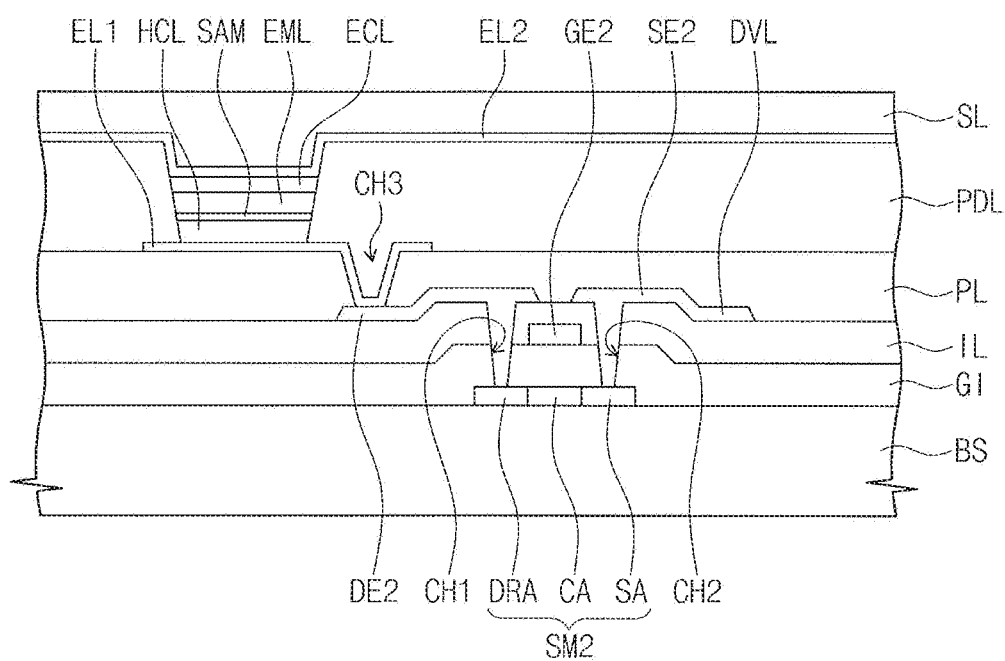
FIG. 11 illustrates a cross-sectional view along line I-I' of FIG. 10.

FIG. 10 illustrates a plan view of one of the pixels included in the display device according to an embodiment, and FIG. 11 illustrates a cross-sectional view taken along I-I' in FIG. 10.

Referring to FIGS. 9 to 11, each of the pixels PX includes a line unit including a gate line GL, a data line DL, and a driving voltage line DVL, thin film transistors TFT1 and TFT2 connected to the line unit, the organic light emitting device OEL connected to the thin film transistors TFT1 and TFT2, and a capacitor Cst.

Each of the pixels PX may emit light of a particular color, for example, one among a red light, a green light, or a blue light. The kind of colored light is not limited to the above, and may also include a cyan light, a magenta light, a yellow light, etc.

The gate line GL extends in the second direction DR2. The data line DL extends in the third direction DR3 intersecting the gate line GL. The driving voltage line DVL extends in substantially the same direction as the data line DL, that is, the third direction DR3. The gate line GL transmits a scanning signal to the thin film transistors TFT1 and TFT2, the data line DL transmits a data signal to the thin film transistors TFT1 and TFT2, and the driving voltage line DVL provides a driving voltage to the thin film transistors TFT1 and TFT2.

The thin film transistors TFT1 and TFT2 may include a driving thin film transistor TFT2 for controlling the organic light emitting device OEL and a switching thin film transistor TFT1 which switches the driving thin film transistor TFT2. In an embodiment, each of the pixels PX is described as including two of the thin film transistors TFT1 and TFT2, and each of the pixels PX may also include one thin film transistor and a capacitor, or be provided with three or more thin film transistors and two or more capacitors.

The switching thin film transistor TFT1 includes a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to a first common electrode CE1 through a fifth contact hole CH5. The switching thin film transistor TFT1 transmits to the driving thin film transistor TFT2, the data signal applied to the data line DL according to the scanning signal applied to the gate line GL.

The thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage line DVL. The second drain electrode DE2 is connected to a first electrode EL1 through a third contact hole CH3.

The first electrode EL1 is connected with a second drain electrode DE2 in the driving thin film transistor TFT2. A common voltage is applied to the second electrode EL2, and a light emitting layer EML emits light according to an output signal of the driving thin film transistor TFT2 to thereby display an image. Here, the light emitted from the light emitting layer EML may change according to the type of dopant contained in the light emitting layer.

The capacitor Cst is connected between the second gate electrode GE2 and second source electrode SE2 in the driving thin film transistor TFT2, and charges and maintains the data signal input into the second gate electrode GE2 in the driving thin film transistor TFT2. The capacitor Cst may include the first common electrode CE1, which is connected with the first drain electrode DE1 through a sixth contact hole CH6, and a second common electrode CE2, which is connected with the driving voltage line DVL.

Referring to FIGS. 10 and 11, the display device 10 according to an embodiment includes a base substrate BS on which the thin film transistors TFT1 and TFT2 and the organic light emitting device OEL are laminated.

Since the display device includes the organic light emitting device OEL described above, descriptions of the specific features of the organic light emitting device OEL will not be repeated below. Other features of the display device will be described.

In the display device, a typical base substrate BS may be used without particular limit. For example, the base substrate BS may be formed of an electrically insulative material such as a glass, a plastic, or quartz. Organic polymers forming the base substrate BS may include polyethylene terephthalate (PET), polyethylene naphthalate (PEN), polyimide, polyethersulfone, etc. The base substrate BS may be selected by considering mechanical strength, thermal stability, transparency, surface smoothness, ease of handling, water resistance, etc.

A substrate buffer layer (not shown) may be provided on the base substrate BS. The substrate buffer layer (not shown) prevents the diffusion of contaminants to the switching thin film transistor TFT1 and the driving thin film transistor TFT2. The substrate buffer layer (not shown) may be formed of silicon nitride (SiNx), silicon oxide (SiOx), silicon oxynitride (SiOxNy), etc., and may also be excluded depending on the material of the base substrate BS and the process conditions.

A first semiconductor layer SM1 and a second semiconductor layer SM2 are provided on the base substrate BS. The first semiconductor layer SM1 and the second semiconductor layer SM2 are formed of semiconductor materials and operate as an activation layer for the switching thin film transistor TFT1 and the driving thin film transistor TFT2, respectively. The first semiconductor layer SM1 and the second semiconductor layer SM2 each include a source area SA, a drain area DRA, and a channel area CA provided between the source area SA and the drain area DRA. The first semiconductor layer SM1 and the second semiconductor layer SM2 may each be formed of a material selected from among an inorganic semiconductor and an organic semiconductor. The source area SA and the drain area DRA may be doped with an n-type dopant or a p-type dopant.

A gate insulating layer GI is provided on the first semiconductor layer SM1 and the second semiconductor layer SM2. The gate insulating layer GI covers the first semiconductor layer SM1 and the second semiconductor layer SM2. The gate insulating layer GI may be formed of an organic insulating material or an inorganic insulating material.

A first gate electrode GE1 and a second gate electrode GE2 are provided on the gate insulating layer GI. The first gate electrode GE1 and the second gate electrode GE2 may be formed so as to respectively cover the areas corresponding to the channel area CA in the first semiconductor layer SM1 and the channel area CA in the second semiconductor layer SM2.

An interlayer insulating layer IL is provided on the first gate electrode GE1 and the second gate electrode GE2. The interlayer insulating layer IL covers the first gate electrode GE1 and the second gate electrode GE2. The interlayer insulating layer IL may be formed of an organic insulating material or an inorganic insulating material.

The first source electrode SE1 and first drain electrode DE1, and the second source electrode SE2 and second drain electrode DE2 are provided on the interlayer insulating layer IL. The second drain electrode DE2 contacts the drain area DRA in the second semiconductor layer SM2 through a first contact hole CH1 formed in the gate insulating layer GI and the interlayer insulating layer IL, and the second source electrode SE2 contacts the source area SA in the second semiconductor layer SM2 through a second contact hole CH2 formed in the gate insulating layer GI and the interlayer insulating layer IL. The first source electrode SE1 contacts the source area (not shown) in the first semiconductor SM1 through a fourth contact hole CH4 formed in the gate insulating layer GI and the interlayer insulating layer IL, and the first drain electrode DE1 contacts the drain area (not shown) in the first semiconductor layer SM1 through the fifth contact hole CH5 formed in the gate insulating layer GI and the interlayer insulating layer IL.

A passivation layer PL is provided on the first source electrode SE1 and first drain electrode DE1, and the second source electrode SE2 and second drain electrode DE2. The passivation layer PL may perform the role of a protective film that protects the switching thin film transistor TFT1 and the driving thin film transistor TFT2, and may also perform the role of a flattening film that flattens the top face thereof.

The first electrode EL1 is provided on the passivation layer PL. The first electrode EL1 may be, for example, a positive electrode. The first electrode EL1 is connected to the second drain electrode DE2 in the driving thin film transistor TFT2 through the third contact hole CH3 formed in the passivation layer PL.

The pixel defining film PDL which partitions the pixel areas (PA in FIG. 4) such that the pixel areas respectively correspond to the pixels PX is provided on the passivation film PL. The pixel defining film PDL exposes the top face of the first electrode EL1 and protrudes from the base substrate BS along the perimeters of each of the pixels PX. The pixel defining film PDL may contain a metal fluoride compound. For example, the pixel defining film PDL may be formed of a metal fluoride compound among lithium fluoride (LiF), barium fluoride ($BaF_2$), and cesium fluoride (CsF). When having a predetermined thickness, the metal-fluoride compound is insulative. The thickness of the pixel defining film PDL may be, for example, about 10 nm to about 100 nm.

The organic light emitting device is provided to each of the pixel areas (PA in FIG. 8) surrounded by the pixel defining film PDL. The organic light emitting device OEL provided is the organic light emitting device according to embodiments described above. The organic light emitting device may include, e.g., the first electrode EL1, the self-assembled monolayer SAM, the hole control layer HCL, the light emitting layer EML, the electron control layer ECL, and the second electrode EL2. In an implementation, the self-assembled monolayer SAM may include, e.g., at least two of the plurality of organic molecules having tails of different lengths. In an implementation, the self-assembled monolayer SAM may include the plurality of organic molecules having, e.g., an aromatic group in the terminal end.

The display device according to an embodiment may include the organic light emitting device which has the self-assembled monolayer. Thus, the molecules in the hole control layer may be randomly arranged such that the color deviation due to viewing angle is limited. In an implementation, the display device according to an embodiment may include the self-assembled monolayer having an aromatic group in an end group, and the color deviation due to viewing angle may be limited by arranging the molecules in the hole control layer to be perpendicular to the first electrode.

An organic light emitting device according to an embodiment may include a self-assembled monolayer between a first electrode and a hole control layer such that deviations in the optical properties due to viewing angle may be minimized by adjusting the arrangement of an organic compound forming the hole control layer.

In an implementation, deviations in the optical properties due to viewing angle may be minimized without a change in the light emitting efficiency or color coordinates by changing the length of the organic compound to thereby randomize the arrangement of the organic compound in the hole control layer disposed on the self-assembled monolayer.

In an implementation, deviations in the optical properties due to viewing angle may be minimized without a change in the light emitting efficiency or color coordinates by chemically bonding the material in the hole control layer with the self-assembled monolayer such that the organic compound in the hole control layer is arranged vertically.

The embodiments may provide an organic light emitting device in which the color deviation due to viewing angle is minimized.

The embodiments may provide an organic light emitting device in which the change in optical properties according to viewing angle is minimized by controlling the arrangement of organic compounds forming a hole control layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting device, comprising:
a first electrode;
a self-assembled monolayer on the first electrode;
a hole control layer on the self-assembled monolayer, the hole control layer comprising an anisotropic compound in which a length in a long axis direction of the anisotropic compound differs from a length in a short axis direction of the anisotropic compound;
a light emitting layer on the hole control layer; an electron control layer on the light emitting layer; and a second electrode on the electron control layer,
wherein the self-assembled monolayer includes a plurality of organic molecules, each organic molecule of the plurality of organic molecules being independently represented by Formula 1,

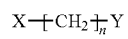
[Formula 1]

wherein, in Formula 1,
X is a phosphonic acid group or a silane group,
Y is hydrogen, a substituted or unsubstituted alkyl group having 1 to 5 carbon atoms, or a substituted or unsubstituted aromatic group having 6 to 30 carbon atoms forming a ring, and
n is an integer of 2 to 20,
wherein the plurality of organic molecules includes a first organic molecule in which n=n1 and a second organic molecule in which n=n2,
wherein n1 and n2 are integers that are different from each other, and
wherein the anisotropic compound in the hole control layer forms an intermolecular bond between terminal ends of the plurality of organic molecules.

2. The organic light emitting device as claimed in claim 1, wherein the plurality of organic molecules are disposed such that X of Formula 1 is bonded with the first electrode and Y of Formula 1 is adjacent to the hole control layer.

3. The organic light emitting device as claimed in claim 1, wherein Y is a phenyl group, a naphthalene group, or an anthracene group.

4. The organic light emitting device as claimed in claim 1, wherein the long axis direction of the anisotropic compound is orthogonal to a surface of the first electrode.

5. An organic light emitting device, comprising:
a first electrode;
a self-assembled monolayer on the first electrode;
a hole control layer on the self-assembled monolayer;
a light emitting layer on the hole control layer;
an electron control layer on the light emitting layer; and
a second electrode on the electron control layer,
wherein the self-assembled monolayer includes a plurality of organic molecules, each organic molecule of the plurality of organic molecules being independently represented by Formula 1,

[Formula 1]

wherein, in Formula 1,
X is a phosphonic acid group or a silane group,
Y is hydrogen, a substituted or unsubstituted alkyl group having 1 to 5 carbon atoms, or a substituted or unsubstituted aromatic group having 6 to 30 carbon atoms forming a ring, and
n is an integer of 2 to 20,
wherein:
the plurality of organic molecules includes a first organic molecule in which n=n1 and a second organic molecule in which n=n2, and
n1 and n2 are integers that are different from each other, and
wherein n1 and n2 satisfy |n1−n2|>10.

* * * * *

UNITED STATES PATENT AND TRADEMARK OFFICE
CERTIFICATE OF CORRECTION

| | | |
|---|---|---|
| PATENT NO. | : 11,152,577 B2 | Page 1 of 1 |
| APPLICATION NO. | : 16/855933 | |
| DATED | : October 19, 2021 | |
| INVENTOR(S) | : Hyunshik Lee et al. | |

It is certified that error appears in the above-identified patent and that said Letters Patent is hereby corrected as shown below:

In the Claims

Column 24, Line 58, Claim 5    delete ">10." and insert -- $\geq$10. --

Signed and Sealed this
Eighth Day of August, 2023

Katherine Kelly Vidal
*Director of the United States Patent and Trademark Office*